United States Patent
Kishimoto

(10) Patent No.: US 10,586,943 B2
(45) Date of Patent: Mar. 10, 2020

(54) DISPLAY APPARATUS AND METHOD FOR ATTACHING DISPLAY PANEL

(71) Applicant: Sakai Display Products Corporation, Osaka (JP)

(72) Inventor: Katsuhiko Kishimoto, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 16/062,104

(22) PCT Filed: Dec. 22, 2017

(86) PCT No.: PCT/JP2017/046190
§ 371 (c)(1),
(2) Date: Dec. 19, 2018

(87) PCT Pub. No.: WO2019/123648
PCT Pub. Date: Jun. 27, 2019

(65) Prior Publication Data
US 2019/0355923 A1    Nov. 21, 2019

(51) Int. Cl.
*H01L 51/52* (2006.01)
*H01L 27/32* (2006.01)
(Continued)

(52) U.S. Cl.
CPC ...... *H01L 51/5237* (2013.01); *B60R 11/0235* (2013.01); *B62D 65/02* (2013.01);
(Continued)

(58) Field of Classification Search
CPC . H01L 51/5237; H01L 27/3244; B62D 65/02; B60R 11/0235; B60R 2011/0026; B60R 2011/0077; B60R 2011/0063
See application file for complete search history.

(56) References Cited

U.S. PATENT DOCUMENTS

| 5,971,468 A * | 10/1999 | King ............... B60J 3/0204 296/97.5 |
| 9,164,547 B1 | 10/2015 | Kwon et al. |
| 10,079,503 B2 * | 9/2018 | Burton ............... H02J 7/35 |

(Continued)

FOREIGN PATENT DOCUMENTS

| FR | 3026885 B3 * | 5/2017 | ............ B60J 3/0208 |
| JP | 2004093789 A | 3/2004 | |

(Continued)

OTHER PUBLICATIONS

PCT International Search Report, PCT Application No. PCT/JP2017/046190, Japan Patent Office, dated Feb. 20, 2018.

(Continued)

*Primary Examiner* — Abhishek M Rathod
(74) *Attorney, Agent, or Firm* — Snell & Wilmer L.L.P.

(57) ABSTRACT

A display apparatus includes: an object (5) having a plane or a curved face; a display panel (3) forming at least one of a concave portion (3a) and a convex portion at any one of a peripheral edges; a holding member (1) mounted in a predetermined location of the object (5), and having a convex portion (1a) or a concave portion which corresponds to the concave portion or the convex portion of the display panel (3), in which the concave portion (3a) or the convex portion of the display panel (3) is engaged with the convex portion (1a) or the concave portion of the holding member; and a weak adhesive layer which is interposed between the object (5) and the display panel (3) to bring the object (5) and the display panel (1) into close contact with each other.

20 Claims, 10 Drawing Sheets

(51) Int. Cl.
  *B62D 65/02* (2006.01)
  *B60R 11/02* (2006.01)
  *B60R 11/00* (2006.01)

(52) U.S. Cl.
  CPC ... *H01L 27/3244* (2013.01); *B60R 2011/0026* (2013.01); *B60R 2011/0063* (2013.01); *B60R 2011/0077* (2013.01)

(56) References Cited

U.S. PATENT DOCUMENTS

| | | | |
|---|---|---|---|
| 10,336,263 B2* | 7/2019 | Ligi, Jr. ................ | B60J 3/0204 |
| 2002/0003571 A1 | 1/2002 | Schofield et al. | |
| 2005/0151396 A1* | 7/2005 | Berberich ............... | B60R 7/04 |
| | | | 296/214 |
| 2005/0200696 A1* | 9/2005 | Schedivy ............ | B60R 11/0235 |
| | | | 348/61 |
| 2007/0019371 A1 | 1/2007 | Yang | |
| 2012/0146357 A1* | 6/2012 | Huang ................. | B60J 3/0208 |
| | | | 296/97.6 |
| 2015/0084364 A1* | 3/2015 | Cha ....................... | B60J 3/0278 |
| | | | 296/97.5 |
| 2016/0082888 A1* | 3/2016 | Kothari .................... | B60R 1/00 |
| | | | 348/148 |
| 2017/0217290 A1* | 8/2017 | Yoshizumi ............... | G09G 3/20 |
| 2018/0334107 A1* | 11/2018 | Polak ..................... | B60K 35/00 |
| 2019/0047383 A1* | 2/2019 | Hu ........................ | B60J 3/0208 |

FOREIGN PATENT DOCUMENTS

| | | |
|---|---|---|
| JP | 2004354814 A | 12/2004 |
| JP | 2011156895 A | 8/2011 |
| JP | 2016097650 A | 5/2016 |

OTHER PUBLICATIONS

English Translation of PCT International Search Report, PCT Application No. PCT/JP2017/046190, Japan Patent Office, dated Feb. 20, 2018.

\* cited by examiner

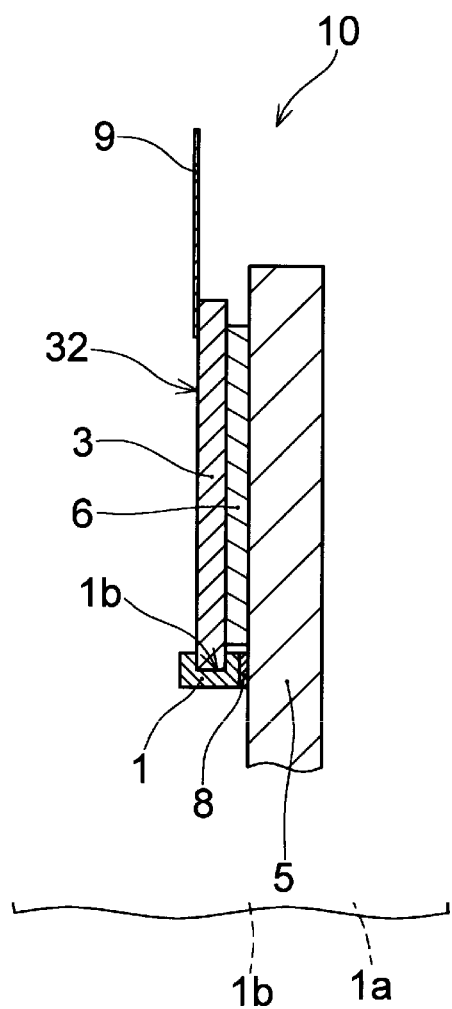

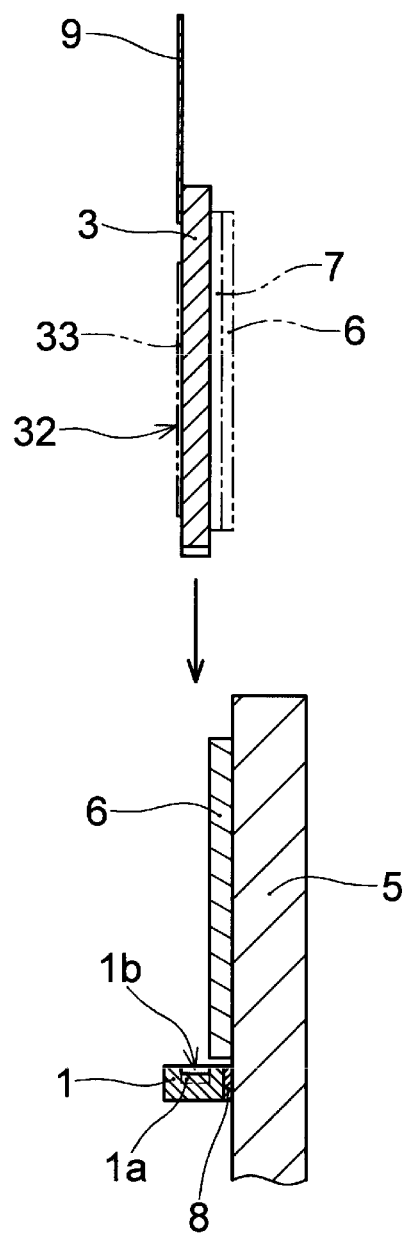

DISPLAY APPARATUS AND METHOD FOR ATTACHING DISPLAY PANEL

CROSS-REFERENCE TO RELATED APPLICATIONS:

This patent application is a U.S. National Stage of International Application No. PCT/JP2017/046190, filed on Dec. 12, 2017 (pending).

TECHNICAL FIELD

The present invention relates to a display apparatus and a method for attaching a display panel.

BACKGROUND ART

In recent years, with a request for thickness reduction relative to a liquid crystal display apparatuses, an organic EL display apparatuses or the like and an extended application relative to these flat display apparatuses, the spread of thin and preferably flexible display panels has been accelerated. In many cases, thin display panels are used to be bonded with an arbitrary supporting member in order to impart shape maintainability and mechanical strength or according to a specific circumstance in each situation of use. For example, in Patent Document 1, there is disclosed a method for bonding an image display panel such as a liquid crystal display panel with a window glass used for digital signage. In the method disclosed in Patent Document 1, an image display panel disposed to be spaced from the window glass via an elastic member or the like is pressed towards the window glass while being elastically deformed by rolling of a roller from one end to the other end thereof. Consequently, the image display panel and the window glass are bonded with each other via a layer including a photocurable resin.

PRIOR ART DOCUMENT

Patent Document

Patent Document 1: JP 2016-97650 A

SUMMARY OF THE INVENTION

Problem to be Solved by the Invention

In Patent Document 1, a display panel which is bonded with the supporting member by using an bonding agent composed of a photocurable resin or a thermosetting resin or the like, therefore it is very difficult to remove, from a supporting member. Even if the display panel could be detached, the debris of the bonding agent or the wreckage of the display panel or the supporting member remains on the respective bonding faces and thus the display panel or the supporting member cannot be easily reused. Therefore, in spite of the fact that a defect merely occurs to one of the display panel and the supporting member, it may be inevitable to discard or replace of both of them with the replacement ones. It is also difficult to accurately bond the display panel in a predetermined location when the display panel is bonded with the supporting member. In addition, there is a risk that a breakage of the display panel occurs if movement or rearrangement of the display panel is repeated to position in a proper position, the display panel temporarily disposed in an inappropriate position. Further, there is a problem that in a case where the supporting member is a transparent member such as a windshield of a motor vehicle or a window glass, when the display panel attached to the supporting member is not observed, the field of view is shaded, whereby the display panel becomes an obstacle.

Therefore, an object of the present invention is to provide a method for attaching a display panel which is capable of easily attaching the display panel in a predetermined location on a predetermined plane or curved surface and thereafter capable of easily removing the display panel from the mounted surface as required, and a display apparatus in which a display panel is attached to a transparent supporting member and in which even in a case where the display panel is not observed, a field of view is not degraded.

Means to Solve the Problem

A display apparatus according to Embodiment 1 of the present invention comprises: an object having a plane or a curved face; a display panel having at least one of a concave portion and a convex portion at any part of a peripheral edge; a holding member mounted on a predetermined location of the object, the holding member having a convex portion or a concave portion corresponding and engaging with the concave portion or the convex portion of the display panel; and a weak adhesive layer being interposed between the object and the display panel to bring the object and the display panel into close contact with each other.

A method for attaching a display apparatus of Embodiment 2 of the present invention comprises: preparing a display panel having at least one of a concave portion and a convex portion at any part of a peripheral edge; preparing a holding member having a convex portion or a concave portion corresponding to the concave portion or the convex portion of the display panel; bonding the holding member with an object having a predetermined plane or curved face; forming a weak adhesive layer, using an adhesive agent, on an attachment region of the object with the display panel, or a surface facing to the object in the display panel; combining the display panel to the holding member while engaging the concave portion or the convex portion of the display panel with the convex portion or the concave portion of the holding member; and bringing the display panel into close contact with the object by using the weak adhesive layer.

Effects of the Invention

According to the embodiments of the present invention, a holding member capable of engaging with a display panel is attached in a normal position on a predetermined plane or curved surface and then the display panel can be mounted, so that the display panel can be easily aligned and mounted. Moreover, the display panel is attached by a weak adhesive layer and thus the display panel can be thereafter easily removed from the mounted surface in accordance with the requirement. In addition, the holding member can be made very small because it is sufficient if a concave portion or a convex portion which corresponds to a convex portion or a concave portion of the display panel is formed. And when the holding member is made of a transparent material, it makes more inconspicuous. Consequently, even if the display panel is mounted to a transparent glass such as a window glass or a vehicle windshield of a motor vehicle or the like and then is demounted when the display panel is not in use, the holding member is very unlikely to become an obstacle to a field of view, and a sense of discomfort is not felt.

BRIEF DESCRIPTION OF THE DRAWINGS

FIG. 1C is a sectional view taken along the line IC-IC of FIG. 1A.

FIG. 3C is a side view of FIG. 3B.

EMBODIMENT FOR CARRYING OUT THE INVENTION

Next, embodiments of a method for attaching a display panel and a method for attaching the display panel to a vehicle windshield of a motor vehicle and a display apparatus thus mounted, of the present invention, will be described with reference to the drawings. Materials, shapes and sizes of the constituent elements, and their relative positions or the like in the embodiments described below are merely illustrative. The method for attaching display panel and the display apparatus of the present invention are not construed to be limitative thereto.

Figure 1A:
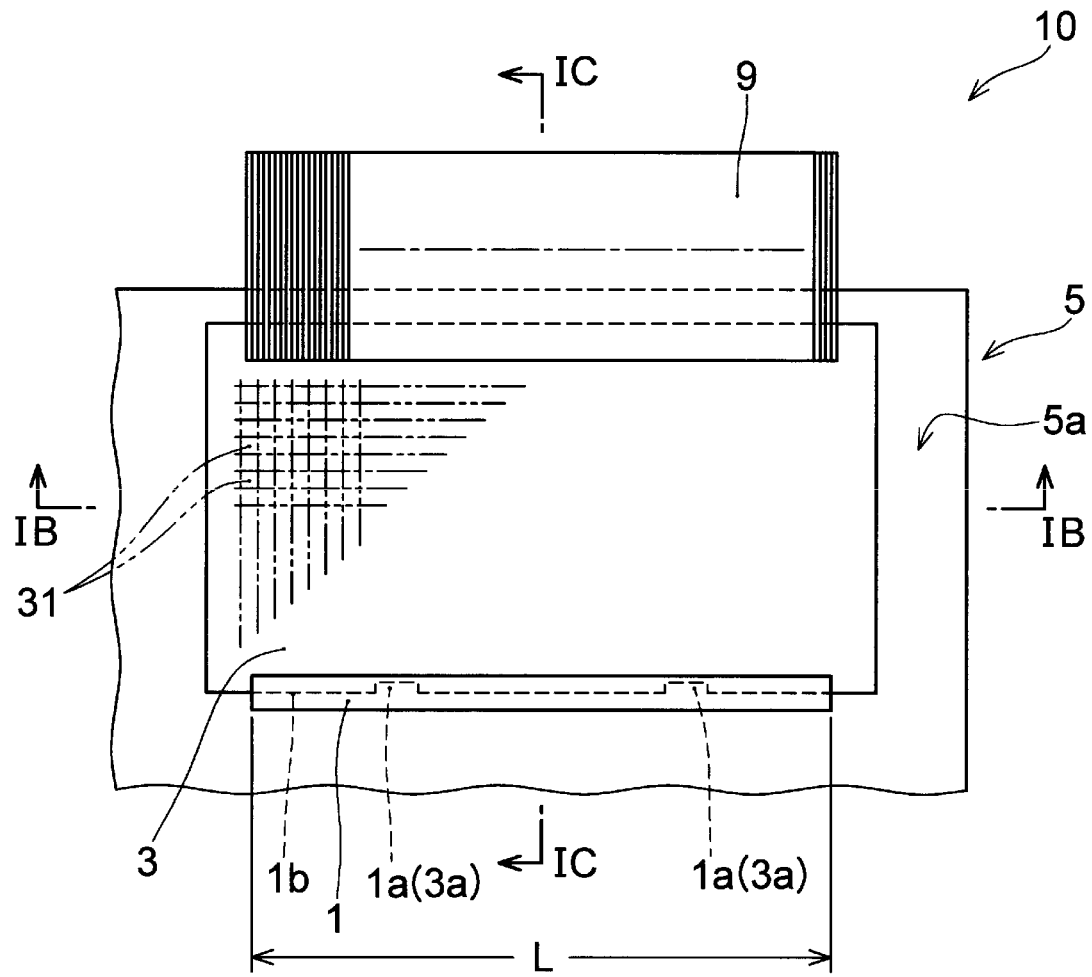
FIG. 1A is a plan view showing a display apparatus of Embodiment 1 of the present invention.
Figure 1B:
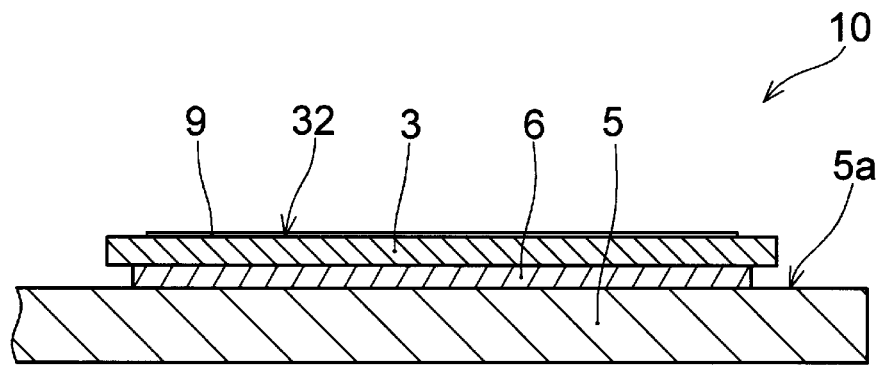
FIG. 1B is a sectional view taken along the line IB-IB of FIG. 1A.

A display apparatus of Embodiment 1 of the present invention, as a plan view and sectional views thereof are shown in FIG. 1A to FIG. 1C, includes: an object 5 having a plane or a curved surface; a display panel 3 having at least one of a concave portion 3a and a convex portion at any part of a peripheral edge; a holding member 1 attached on a predetermined location of the object 5 and having a convex portion 1a or a concave portion corresponding to and engaging with a concave portion 3a or a convex portion of the display panel 3, and a weak adhesive layer 6 interposed between the object 5 and the display panel 3 to bring the object 5 and the display panel 3 into close contact with each other.

Although in the example shown in FIG. 1A, the concave portion 3a is formed in a planar direction of the display panel 3, and the convex portion 1a is formed in a planar direction of the holding member 1, a convex portion may be formed in the display panel 3, and a concave portion may be formed in the holding member 1. However, it is preferable that the concave portion 3a is formed in the display panel 3 because it is easier to prevent damage during handling of the display panel 3 since there is no convex portion in the display panel 3. In addition, a direction of the concave portion and the convex portion is not limited to the planar direction as shown in FIG. 1A, and as shown in FIG. 3D which will be described later, the direction of the concave portion and the convex portion may be formed in a vertical direction to a surface of the display panel 3.

That is, as described previously, if the display panel 3 is directly attached to the object 5, the display panel 3 may be attached to be inclined (rotated) or may be attached in a location which is displaced from an expected location. In such a case, if an attempt is made to reattach the display panel, a bonding agent or the like may remain on the object 5, or alternatively, the display panel 3 may be damaged. Further, in a case where the display panel 3 is attached to a windshield of a motor vehicle or a window glass, as the object 5, if the display panel 3 is not observed, the display panel may become an obstacle, and however, it has been conventionally difficult to easily release or reattach the display panel.

Accordingly, in the present embodiment, there is provided a structure in which the holding member 1 is attached to the object 5 so that the display panel 3 is attached in a predetermined location of the object 5 and in a easily detachable manner, and the display panel 3 is engaged with the holding member 1. That is, a display apparatus as shown in FIG. 1A to FIG. 1C is obtained by carrying out positioning as to the display panel 3 free of the weak adhesive layer 6 (a dummy sample having its adjusted external shape is also available) and the holding member 1, firstly attaching the holding member 1 to the object 5 and thereafter providing the weak adhesive layer 6 on an attachment surface of the display panel 3 or in a region in which the display panel 3 of the object 5 is to be attached and subsequently attaching the display panel 3.

A fluorine resin such as PTFE, a polyacetal resin, or a polyamide resin or the like may be used for example, in the holding member 1. However, in view of the function of restraining the dislocation of the display panel 3 when in use, a silicone resin, a natural, synthetic rubber or the like which have an appropriate frictional coefficient may be used as a material for the holding member 1. In addition, the holding member 1 may be formed using a light transmissible material unlikely to be recognized for a user of the display panel 3. To use the light transmissible material is particularly useful in a case where the object 5 having a surface 5a to be attached is formed of the light transmissible material (such as a glass, transparent polyimide, PET or the like) and further the display panel 3 has light transmissibility. In this respect, it is preferable that the holding member 1 is formed using a transparent silicone-based rubber, an acryl-based resin or the like, and the holding member 1 may be formed using a glass. When the holding member 1 is formed of a light transmissible material, it can be unlikely to become an obstacle to a field of view.

Figure 2A:
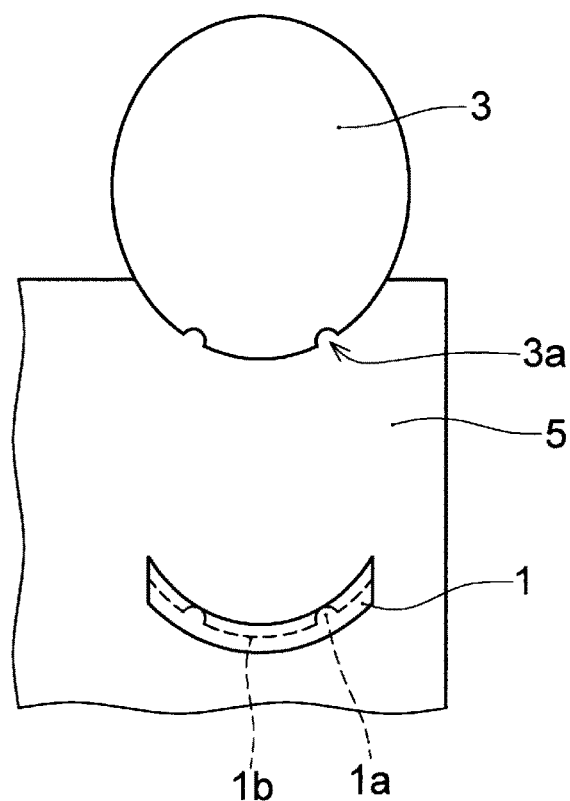
FIG. 2A is a view illustrating another example of the display apparatus of FIG. 1A.

In the holding member 1, there is formed the convex portion 1a or the concave portion capable of engaging with the concave portion 3a or the convex portion that are formed at an outer peripheral edge of the display panel 3 which will be described later. The convex portion 1a is formed to certainly carry out positioning between the display panel 3 and the holding member 1 with eliminating displacement in the side way of the display panel 3, or misaligned or rotated attachment of the display panel 3 in the case where the external shape of the display panel 3 is a rotatable shape such as a circular shape, as shown in FIG. 2A which will be described later. Therefore, it is sufficient that the convex portion 1a is capable of engaging with the concave portion 3a of the display panel 3. It is also sufficient that the engagement between the convex portion 1a and the concave portion 3a and there may be a slight gap.

Figure 6A:
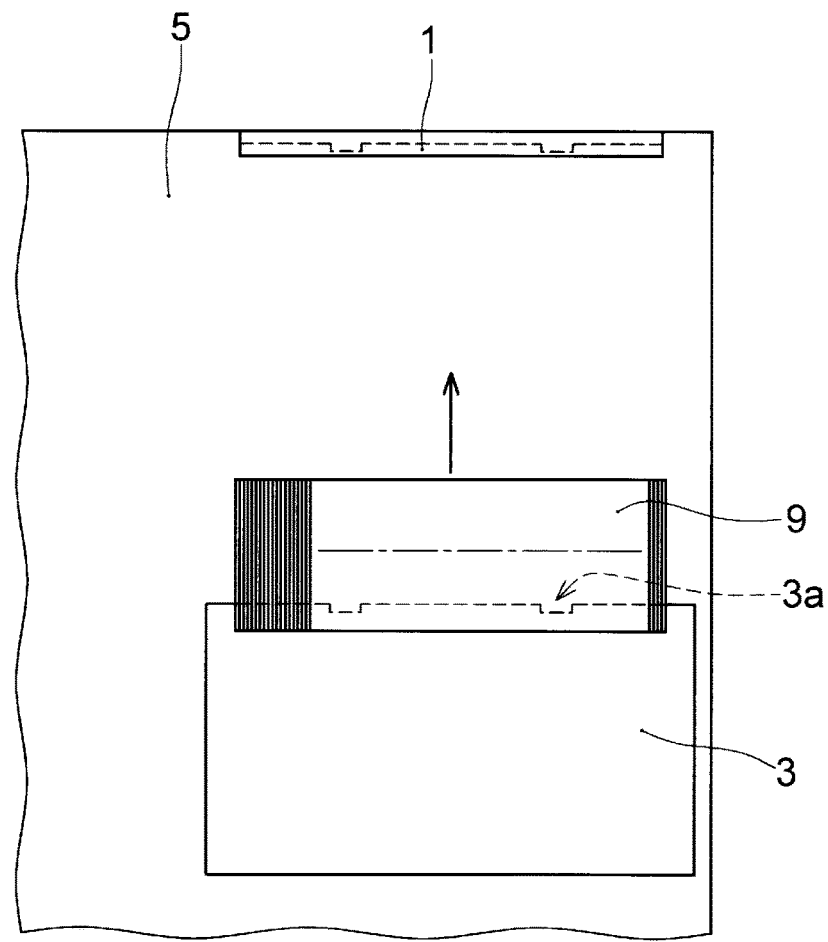
FIG. 6A is a view illustrating a mounting method in an example of a case in which the holding member is mounted to an outer edge of an object to which the display panel is to be mounted.
Figure 6B:
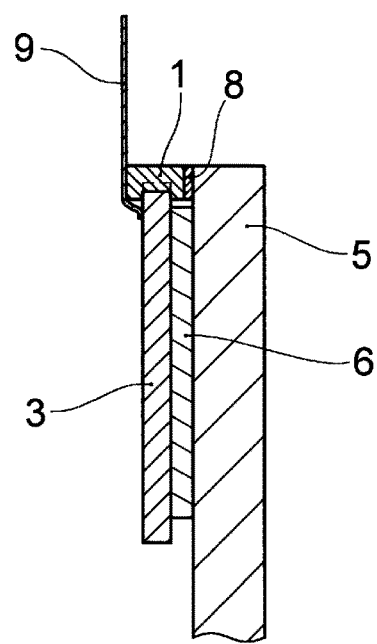
FIG. 6B is a sectional side view in a state in which the display panel is mounted in the example of FIG. 6A.

The holding member 1, as shown in FIG. 1A, functions as a supporting member of the display panel 3 as well as positioning of the display panel 3, when the holding member 1 is a structure to be engaged at a lower side of the display panel 3. In addition, as shown in FIG. 1C, a groove 1b into which a lower part of the display panel 3 can be inserted is formed. A depth of the groove 1b is of the order of 1 to 2 mm. The groove 1b is not limited to a case in which the holding member 1 is provided at the lower part of the display panel 3, and even in a case where the holding member 1 is provided at an upper part of the display panel 3, as shown in FIG. 6A and FIG. 6B, the groove 1b contributes significantly to support the display panel 3, which will be described later.

Figure 2B:
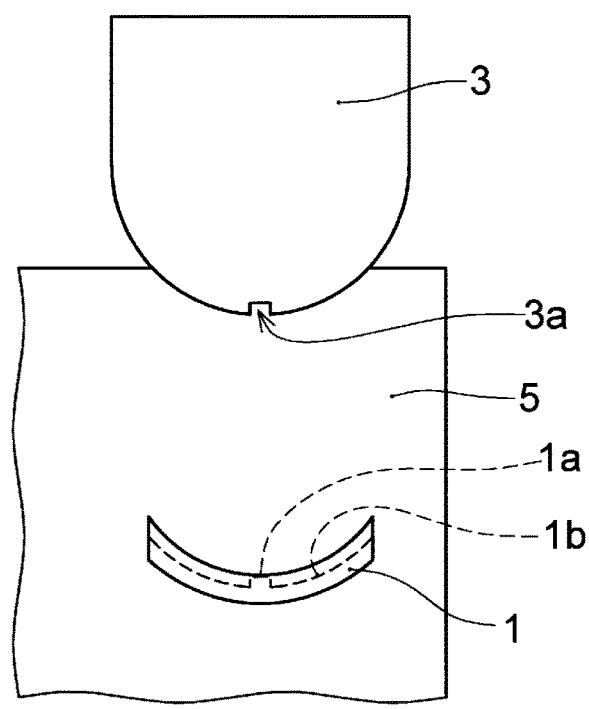
FIG. 2B is a view illustrating another example of the display apparatus of FIG. 1A.
Figure 2C:
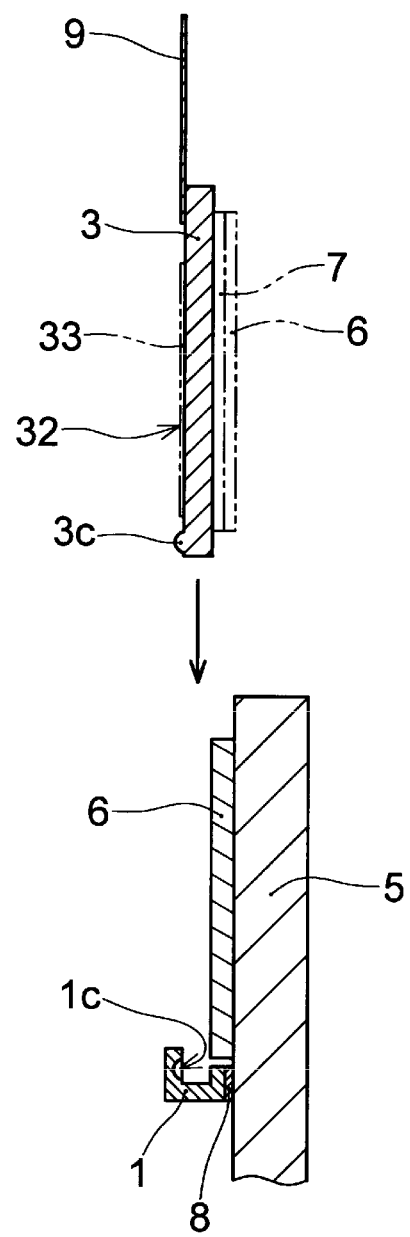
FIG. 2C is a view illustrating a still another example of the display apparatus of FIG. 1A.
Figure 2D:
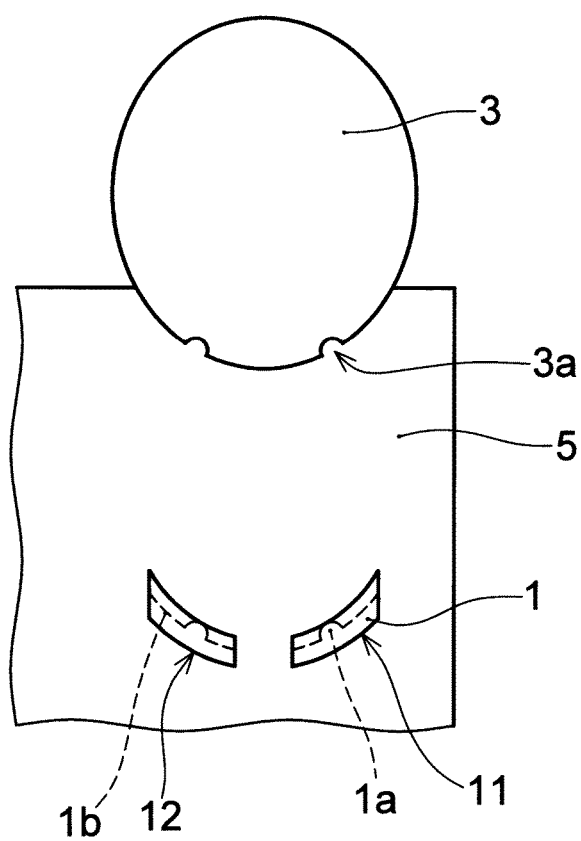
FIG. 2D is a view illustrating a still another example of the display apparatus of FIG. 1A.

The holding member 1 may be formed with one piece (section) or may be attached to be divided into a plurality of pieces 11, 12 as shown in FIG. 2D. That is, the holding member 1 may be formed with a section having an engaging portion of the concave portion or the convex portion, and another section having no engaging portion of concave portion or the convex portion intended to merely hold the display panel 3. If the holding member is divided into a plurality of sections, a length of each section can be reduced, the holding member is made inconspicuous, and an effect of holding the display panel 3 increases. In a case where the holding member is formed with one section, the more significantly a length L of the holding member 1 increases, the more easily the display panel 3 is supported. This is preferable. However, in a case where the object 5 to which the display panel 3 is to be attached is capable of observing a scene of the front side, as windshield of a motor vehicle or a window glass of building for example, the shorter the holding member 1 is, the further preferable it is, in view of the fact that the display panel 3 becomes an obstacle to a field of view when not in use. In this point of view, it is preferable that the length L of the holding member 1 is $\frac{1}{12}$ or more and $\frac{1}{3}$ or less of a full length of the outer peripheral edge of the display panel 3 (the full length means a length presupposing that no concave portion and convex portion are formed at the outer peripheral edge), and it is further preferable that the above length is $\frac{1}{4}$ or less thereof. In a case where the holding member is divided into a plurality of sections, it is preferable that a length of each section is $\frac{1}{50}$ or more and $\frac{1}{12}$ or less of a total length of an outer peripheral edge of the display panel 3. In a case where the holding member is divided into the plurality of sections, the entirety of the plurality of sections is aligned to the external shape of the engaging part of the display panel 3, and, in a case where the holding member is formed with one section, the single section is formed to be aligned thereto. That is, in the example shown in FIG. 1A, the engaging part is planar in shape, and in the examples shown in FIG. 2A and FIG. 2B, the engaging part is formed in a curved shape.

The holding member 1 is bonded with the surface 5a to be attached of the object 5 after the positioning with considering the position of the display panel 3. Although a means for bonding the holding member 1 with the surface 5a to be attached of the object 5 is not limited in particular, for example, the holding member 1 is bonded with the surface 5a to be attached by using the bonding agent 8 (refer to FIG. 1C). If necessary, heating processing is carried out in order to cure the bonding agent 8. The bonding agent 8 may be applied to either one of or both of a bonding surface of the holding member 1 and the surface 5a to be attached or the bonding agent which is formed in a frame-shaped sheet, may be placed between the holding member 1 and the surface 5a of the object 5 (refer to FIG. 1).

The bonding agent 8 is not particularly limited as long as it is possible to develop the bonding strength capable of stably bonding the holding member 1 with the surface 5a to be attached of the object 5. An arbitrary epoxy-based bonding agent or acryl-based bonding agent can be used as the bonding agent 8. Preferably, the bonding agent 8 that is light transmissible is used to bond the holding member 1. As described previously, in a case where the holding member 1 is formed using a light transmissible material, it is particularly preferable to use the bonding agent 8 that is light transmissible. For example, any bonding agent which is called OCA (Optical Clear Adhesive) or OCR (Optical Clear Resin) such as film-like or paste-like acryl-based, silicone-based, or urethane-based bonding agent, can be used as the bonding agent 8. The bonding strength between the holding member 1 and the surface 5a to be attached that is obtained by the bonding agent 8 is larger than 5.0 N/10 mm and 10 N/10 mm or less, for example.

As the display panel 3, an organic EL display panel or a liquid crystal display panel is exemplified. However, the display panel 3 is not limited thereto. The display panel 3 is provided with a plurality of pixels 31 which are arranged in a matrixed manner. In addition, a display apparatus of the present embodiment may be formed using the display panel 3 having flexibility, and the display panel 3 formed of a material having light transmissibility such as a transparent organic EL display panel may be used. This is because in a case where the abovementioned object 5 is the windshield of the motor vehicle or the window glass, the scene of the front side is easily visually recognized, and even if the surface 5a to be attached is the curved surface, the display panel can be easily attached thereto. As long as the display panel 3 is light transmissible, in a case where the display panel 3 is not in use, the scene of the front side can be observed even if the display panel 3 is detached.

At the outer peripheral edge of the display panel 3, there is formed the concave portion 3a or a convex portion which corresponds to the convex portion or the concave portion of the holding member 1 described previously. In a case where a convex portion is formed at the engaging part of the holding member 1, the concave portion 3a is formed at the corresponding outer peripheral edge of the display panel 3. In a case where a substrate of the display panel 3 is formed of a resin film such as polyimide, when an outer peripheral edge of the substrate is cut by laser light or the like, the concave portion 3a or the convex portion can be formed at a part to be engaged with the holding member 1 at the outer peripheral edge. In a case where the substrate of the display panel 3 is made of a glass, an accessory which is designed so as to extend the convex portion in a horizontal direction may be attached. Even when a case where the convex portion is formed in a vertical direction of the display panel 3, a projective piece can be attached. In a case where the substrate of the display panel 3 is made of the glass, the concave portion 3a can be formed by the laser light or the like after the substrate has been cut in a rectangular shape. It is further preferable that the concave portion 3a is formed on the display panel 3 because the engaging part is unlikely to damage at the time of conveyance or mounting.

The external shape of the display panel 3 is not limited to the rectangular shape shown in FIG. 1A. As a circular shape shown in FIG. 2A for example, the external shape may be one having a curved part at the outer edge. In this case, the holding member 1 described above is also formed in a curved shape which corresponds to the external shape of the display panel 3. Even if the external shape of the display panel 3 is the curved shape, as shown in FIG. 2A, the concave portion 3a is formed at the outer peripheral edge. In a case where an engaging part with the holding member 1 is thus circular in shape, even if the display panel 3 rotates in particular, the display panel 3 is likely to get into the correct portion and thus the concave portion 3a exerts its own effectiveness. That is, even if the external shape of the display panel 3 is a circular shape, there are many cases in which a top and bottom relationship such as clock display or image display is essential. An image of the display panel 3 is hardly observed if the display panel 3 is attached in rotated state. Thus, in the present embodiment, in order to clarify the top and bottom thereof, the concave portion 3a is formed at a lower edge of the display panel 3 for example, and the convex portion 1a is formed at the holding member 1 that corresponds thereto, and the top and bottom relationship of the display panel 3 is thereby accurately secured. Of course, for of the concave portion or convex portion of the display panel 3 corresponds to the location of the holding member 1 in accordance with the mounting location of the holding member 1.

Although the concave portions 3a may be present in plurality, if the plurality of concave portions are formed at equal intervals as in a gear for example, that is not preferable because the positioning for rotation cannot be obtained. Thus, in a case where the concave portions 3a are formed in plurality, it is preferable that the intervals be different from each other. However, as long as a single concave portion is present, such positioning can be obtained and thus a fewer number of such concave portions are preferable in terms of the manufacturing steps. The groove 1b that is formed in the holding member 1 is also formed along an external arc of the display panel 3.

The external shape of the display panel 3 is not limited to such a circular shape, and as shown in FIG. 2B, a part thereof may be formed in an arc shape, and the remaining part thereof may be formed in a linear shape. In addition, a curved part may be formed in another curved shape such as an elliptical shape without being limited to an arc shape of a perfect circle. It is sufficient that the holding member 1 is formed in a shape corresponds to the external shape of the display panel 3 is formed. In addition, even if the display panel 3 has an external shape as shown in FIG. 2B, the curved part does not need to be held by the holding member 1, and the holding member 1 may be a structure intended to hold the linear shape part of the display panel 3. That is, holding of the display panel 3 by the holding member 1 may be achieved at a side part or an upper part of the display panel 3 without being limited to a lower part of the display panel 3. In this case, there is no problem because the display panel is bonded with the object 5 by way of the weak adhesive layer 6.

Further, as described previously, the concave portion and the convex portion may be formed in the vertical direction with respect to a surface of the display panel 3 in place of being formed in the horizontal direction thereof. The example is illustrated in FIG. 2C which shows a state before the holding member 1 and the display panel 3 are engaged with each other. That is, a convex portion 3c is formed in such a manner as to project from the surface of the display panel 3, and in the holding member 1, the concave portion 1c engaging with the convex portion 3c is formed. Such a kind of concave portion and convex portion may be present. A reversed relationship between the concave portion and the convex portion may also be established.

In addition, as shown in FIG. 1A, the wiring board 9 is connected to the display panel 3. The wiring board 9 electrically connects a driver (not shown) which supplies a drive signal to the display panel 3 and the display panel 3 to each other. Examples of the wiring board 9 include a flexible printed circuit (FPC) having a flexible film formed of a resin such as polyimide or polyethylene terephthalate and a wiring pattern formed on the flexible film using a conductor such as copper. The wiring board 9 is connected to the display panel 3 at one end of the wiring board 9. Such one end of the wiring board 9 is connected, using an anisotropic conductive film (ACF), to a connection pad (not shown) provided on a display surface 32 of the display panel 3. In place of the wiring board 9, a plurality of cables may be used and one ends of such cables may be connected to the display panel 3.

The weak adhesive layer 6 is interposed between the display panel 3 and the surface 5a to be attached. Owing to the adhesiveness that the weak adhesive layer 6 has, preferably in a substantially gapless state, the display panel 3 and the surface 5a to be attached are brought into close contact with each other.

The weak adhesive layer 6 is composed of an adhesive agent consisting essentially of an acryl-based resin, a silicone-based resin, or a urethane-based resin, for example, solely or in combination of a plurality of these resins. The term "weak adhesive" refers to the adhesion to an extent enough to adhere to an adhesion object tightly and yet to be released easily from the adhesion object when subjected to a force in a releasing direction without causing any damage to the adhesion object or leaving any glue on the adhesion surface. By forming the weak adhesive layer 6, the display panel 3 and the surface 5a to be attached of the object 5 are substantially securely brought into close contact with each other. Therefore, it is possible to inhibit floating of the display panel 3 and generating air bubbles with an interface between the display panel 3 and the surface 5a to be attached or the like. Moreover, the display panel 3 can be easily removed as required without having excessive damage to the display panel 3 or the object 5.

The acryl-based resin has superior weather resistance and heat resistance and moreover has superior transparency. In a case where the display panel 3 is a transparent organic EL display panel and the display panel 3 is attached to an arbitrary transparent object 5, the weak adhesive layer 6 with high transparency is preferable in view that the layer hardly influences transparency. The silicone-based resin also has superior weather resistance and transparency and further has superior heat resistance in particular, and hardly changes to yellow and thus is preferable as a material for the weak adhesive layer 6.

In addition, the weak adhesive layer 6 is preferably formed using an adhesive agent which does not have adhesiveness under a normal pressure but develops adhesiveness by being pressurized. Here, the expression "does not have adhesiveness" means that in a state where an exposed surface of the weak adhesive layer 6 formed on the surface 5a to be attached or on the display panel 3 and the object around the exposed surface come into contact with each other, the weak adhesive layer 6 does not have any adhesiveness to such an extent that a slide relative to the object is hindered. If the weak adhesive layer 6 is formed in that way, when the display panel 3 is moved towards the holding member 1, even in a case where the weak adhesive layer 6 and the display panel 3 (the surface 5a to be attached in a case where the weak adhesive layer 6 is formed on the display panel 3) come into contact with each other, the display panel 3 can be moved smoothly without any problem. Then, by pressing the display panel 3 towards the surface 5a to be attached after the display panel 3 has been moved as described below, it is possible to cause the weak adhesive layer 6 to develop the adhesiveness and to bring the weak adhesive layer 6 into close contact with the display panel 3. A general pressure sensitive adhesive agent can be used for the adhesive agent which develops the adhesiveness by applying a pressure. For example, a double-sided adhesive tape provided with a weak adhesive film formed of a pressure sensitive adhesive agent is used as the weak adhesive layer 6.

An adhesion strength between the weak adhesive layer 6 and either one of or both of the display panel 3 and the surface 5a to be attached is, for example, 0.02 N/10 mm or more and 5.0 N/10 mm or less, and is preferably 1.5 N/10 mm or more and 2.0 N/10 mm or less. If the adhesion strength of this range is obtained, it is considered that the possibility that the display panel 3 is unintentionally separated from the surface 5a to be attached is low. In addition, it is considered that when detaching the display panel 3 intentionally from the surface 5a to be attached, the display panel 3 and the surface 5a to be attached can be easily separated from each other merely by pulling the display panel 3 with an appropriate force.

Thus, the display panel 3 in the display apparatus 10 of the present embodiment is held by the holding member 1 as well as being bonded with the weak adhesive layer 6, so that the display panel 3 that is attached to the surface 5a to be attached can be prevented from separating from the surface 5a to be attached or significantly displaced on the surface 5a to be attached during use. That is, in the present embodiment, it is not always necessary to fix the display panel 3 on the surface 5a to be attached by using a bonding agent or the like. Meanwhile, the display panel 3 of the display apparatus 10 of the present embodiment can be easily detached from the surface 5a to be attached. Consequently, in a case where the surface 5a to be attached is a surface of a window glass, when the window glass breaks, the display panel 3 can be reused by detached from the surface 5a to be attached. Alternatively, when the display panel 3 becomes inoperative, the display panel 3 can be easily replaced with another new display panel 3. That is, in spite of the fact that a defect or malfunction merely occurs in either one of the display panel 3 and the arbitrary object 5 having the surface 5a to be attached, it is possible to avoid discarding both of them.

In addition, for example, even when the display panel 3 is bonded with the windshield of the motor vehicle or the window glass described previously, in a case where the display panel 3 is not in use, the display panel 3 can be easily detached, and the field of view of the front side is not shaded. In a case where a bonding force weakens owing to repetition of attaching and detaching activity, the display panel 3 can be securely attached by replacing the weak adhesive layer 6 with another new one.

Referring to FIG. 1A to FIG. 1C, the display apparatus of the present embodiment will be described in further detail. In FIG. 1A to FIG. 1C, the display panel 3 attached to the surface 5a to be attached of the object 5 is shown together with the holding member 1. By attaching the display panel 3 is attached to the surface 5a to be attached, the display apparatus 10 including at least the display panel 3, the holding member 1, and the object 5 having the surface 5a to be attached is obtained. FIG. 1B shows a cross section taken along the line IB-IB shown in FIG. 1A, and FIG. 1C shows a cross section taken along the line IC-IC. As shown in FIG. 1A to FIG. 1C, the holding member 1 that is formed in the rod-like shape is bonded with the surface 5a to be attached by using the bonding agent 8. The holding member 1, which is attached on the bonding surface of the object 5, includes: the groove 1b into which a part of the peripheral edge of the display panel 3 can be inserted; and the convex portion 1a described previously. The display panel 3 is provided with a plurality of pixels 31 arranged in a matrixed manner, and is held on the surface 5a to be attached by way of the holding member 1. The wiring board 9 is connected to the display panel 3, and the wiring board 9 is drawn upward of the display panel 3.

The surface 5a to be attached, as described previously, may be a plane surface as in the examples of FIG. 1A to FIG. 1C or may be a curved surface. The object 5 having the surface 5a to be attached as one of surfaces thereof may be any member, any article, or any structure on which the display panel 3 can be attached on the one surface (surface 5a to be attached). The object 5 can be formed using any material such as a glass, a metal, or a synthetic resin or the like. In a case where the display panel 3 has flexibility, it is preferable that the object 5 have rigidity sufficient to appropriately support the display panel 3. That is, the object 5 may be an armoring member referred to, for example, case, cover, or casing and having a predetermined rigidity to impart durability against external mechanical stress to the display panel 3. In addition, on the surface (mainly the surface other than the surface 5a to be attached) of the object 5, a desired decoration may be applied, and the object 5 may have a shape suitable for a situation in which the display panel 3 is used. Therefore, a display apparatus provided with the display panel and the covering member and having a desired rigidity, decorativeness, and easiness of handling can be manufactured by attaching the display panel to the given plane surface or curved surface by using the method for attaching display panel according to the present embodiment. Further, the object 5 may also be any member constituting various devices, apparatuses, tools or structures other than the display panel 3 or may be a part thereof. For example, the object 5 may be a glass plate used in a household window, a show window, or an exhibition case or the like, and may be a member constituting the casings of various apparatuses or the interior or exterior walls of building.

Furthermore, the object 5 may be a vehicle windshield, and the surface 5a to be attached may be a surface of the vehicle windshield oriented to an interior of the vehicle. An arbitrary device or apparatus provided with a display panel can be manufactured by attaching the display panel to the given plane surface or the given curved surface by using the method for attaching display panel according to the present embodiment.

Next, referring to FIG. 3A to FIG. 3D, the method for attaching the display panel 3 of the display apparatus 10 shown in FIG. 1A will be described in detail. In FIG. 3A to FIG. 3D, similar constituent elements to those shown in FIG. 1A to FIG. 1C described previously are designated with same reference numerals as those of FIG. 1A or the like, and a duplicate description thereof is appropriately omitted.

Figure 3A:
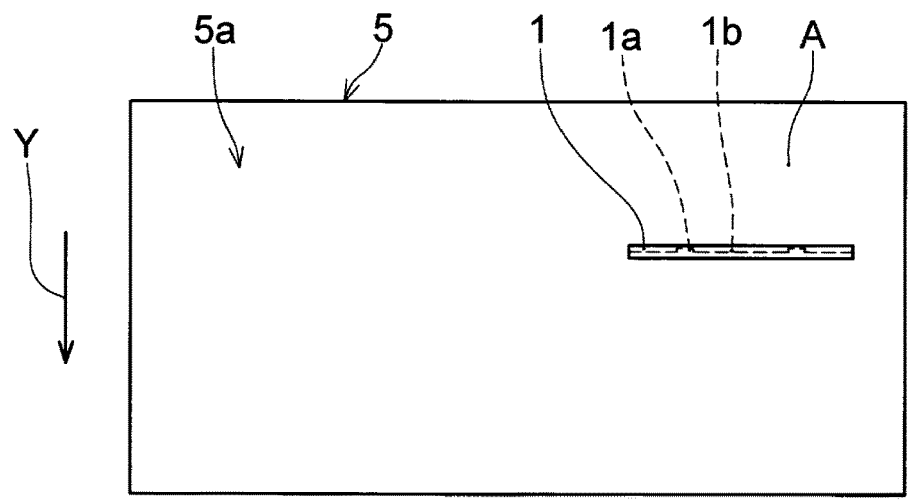
FIG. 3A is a view illustrating a method for mounting a display panel by using a holding member.

As shown in FIG. 3A, the holding member 1 in which the convex portion 1a and the groove 1b are formed is bonded, by the bonding agent 8 (refer to FIG. 1C), with the surface 5*a* to be attached of the object 5, in a state in which the groove 1*b* is faced up and a space capable of attaching the display panel 3 is ensured.

The holding member 1 is bonded in a location to ensure the region A for attaching in which the display panel 3 (refer to FIG. 3B) is to be mounted in the surface 5*a* to be attached. That is, in the example shown in FIG. 3A, the holding member 1 is positioned so as to be taken along a lower end of the region A for attaching. For example, when the region A for attaching is rectangular (that is, the front shape of the display panel 3 is rectangular), outside a lower edge of the region A for attaching, the holding member 1 is positioned along one edge thereof. The display panel 3 can be attached in an arbitrary location in the surface 5*a* to be attached that is one surface of the object 5. Therefore, the holding member 1 can be bonded in an arbitrary location in the surface 5*a* to be attached as well.

In the example of FIG. 3A, the holding member 1 is bonded so that when the display panel 3 is mounted, an upper end of the display panel 3 is substantially proximal to a top surface (upper edge) of the object 5. The object 5 is oriented in an arbitrary orientation relative to the gravitational direction when the display panel 3 is in use. For example, the object 5 is provided in an orientation in which the gravity acts on the direction indicated by the arrow Y in the example of FIG. 3A.

Figure 3B:
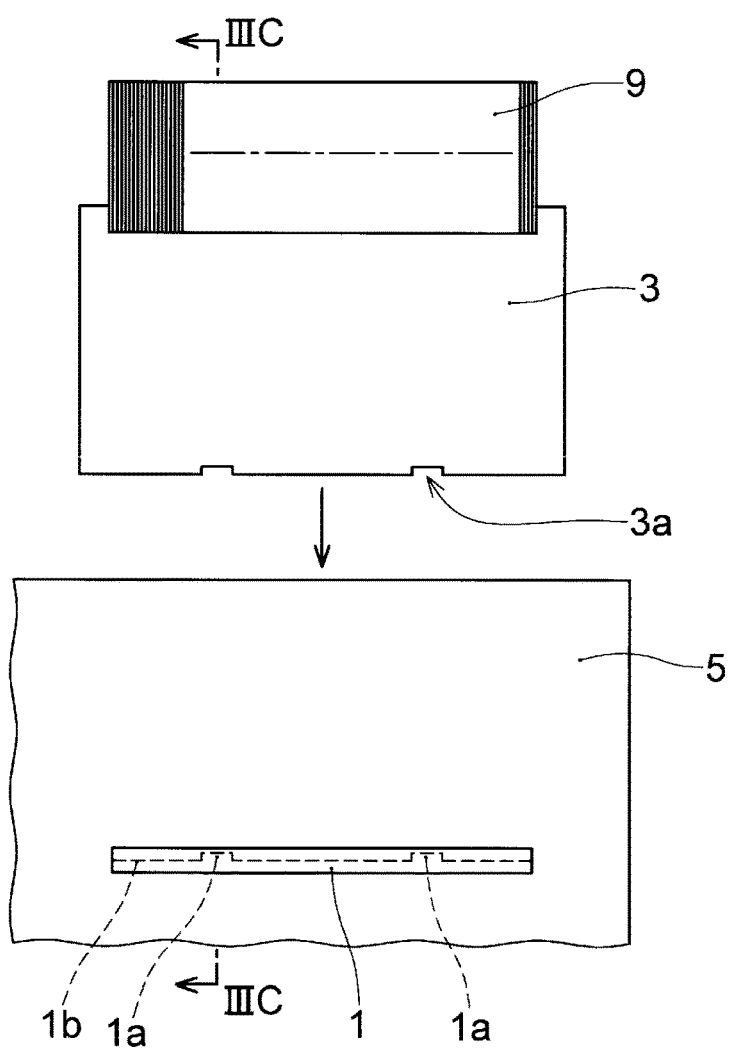
FIG. 3B is a view illustrating the method for mounting the display panel by using the holding member.
Figure 3D:
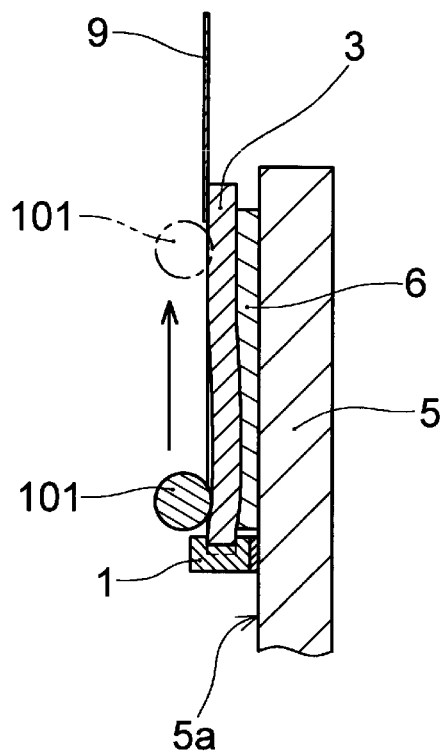
FIG. 3D is a view illustrating the method for mounting the display panel by using the holding member.

Next, as shown in FIG. 3C which is a side view of FIG. 3B and FIG. 3B, a lower end of the display panel 3 is introduced so as to engage into the groove 1*b* of the holding member 1. Prior to this, preferably, on the surface 5*a* to be attached, the weak adhesive layer 6 is formed using the adhesive agent. The weak adhesive layer 6 may be provided, not on the surface 5*a* to be attached, but on the surface of the display panel 3 facing to the surface 5*a* to be attached, as indicated by the double-dotted chain line in FIG. 3C. The weak adhesive layer 6 is formed by arranging the weak adhesive sheet formed by shaping the adhesive agent in a predetermined shape, for example, on the surface 5*a* to be attached or on the surface of the display panel 3 facing to the surface 5*a* to be attached.

In addition, the method for attaching the display panel of the present embodiment, as shown in FIG. 3C, may further include providing a strong adhesive layer 7 having an adhesive force which is equal to or more than the adhesive force of the weak adhesive layer 6 between the weak adhesive layer 6 and the display panel 3 in addition to formation of the weak adhesive layer 6. In a case where the weak adhesive layer 6 is formed on the surface 5*a* to be attached, the strong adhesive layer 7 can be formed between the weak adhesive layer 6 and the surface 5*a* to be attached. The strong adhesive layer 7 can come into close contact with the display panel 3 or the weak adhesive layer 6 at stronger adhesive strength than the adhesive strength between the weak adhesive layer 6 and the surface 5*a* to be attached or the display panel 3. If the strong adhesive layer 7 thus bonded with the weak adhesive layer 6 is formed, the display panel 3 can be removed from the surface 5*a* to be attached while the weak adhesive layer 6 is left on either desired one of the display panel 3 and the surface 5*a* to be attached. Consequently, the work of detaching and replacing the display panel 3 may be easily carried out.

Each of the adhesion strength between the strong adhesive layer 7 and the display panel 3 and the adhesion strength between the strong adhesive layer 7 and the surface 5*a* to be attached is 2.5 N/10 mm or more and 20 N/10 mm or less for example, and is preferably 5.0 N/10 mm or more and 20 N/10 mm or less. As long as such relation among the adhesion strength is maintained, the display panel 3 can be detached in a state that the weak adhesive layer 6 is securely adhered to a desired element (display panel 3 or surface 5*a* to be attached). The strong adhesive layer 7 can also be formed using a material including an acryl-based resin, silicone-based resin, or urethane-based resin as main component. In addition, the weak adhesive layer 6 and the strong adhesive layer 7 may be laminated via a film material made of polyethylene terephthalate or the like.

As the display panel 3 to be attached using the method for attaching the display panel of the present embodiment, as described above, an organic EL display panel or a liquid crystal display panel or the like is exemplified. However, the display panel 3 is not limited thereto. The wiring board 9 is connected to the display panel 3 by, for example, thermocompression bonding using the ACF as described above. The wiring board 9 and the display panel 3 may be connected to each other using a connector not shown.

In the method of the present embodiment, it is preferable that permeation of moisture to an interface between the display panel 3 and the surface 5*a* to be attached is reliably prevented in view of maintenance of the state of close contact therebetween. Therefore, in order to prevent entry of moisture into the display panel 3, prior to attaching of the display panel 3 to the surface 5*a* to be attached, a barrier film 33 (refer to FIG. 3C) may be formed using a moisture impermeable material on the display surface 32. As the moisture impermeable material, silicon nitride, silicon oxide, and silicon nitride oxide or the like is exemplified. As the barrier film 33, one of a silicon nitride film, a silicon oxide film, and a silicon nitride oxide film may be formed, or two or more of these films may be formed in a laminated state. Further, in addition to these films formed using an inorganic material, a barrier film 33 including an organic film formed using an epoxy resin or an acrylic resin may be formed. The film formed using an inorganic material such as a silicon nitride film can be formed using a PECVD technique or a sputtering technique or the like. An organic film can be formed using a printing technique employing an inkjet printer.

Subsequently, the display panel 3 is inserted into the groove 1*b* of the holding member 1. In the examples of FIG. 3A to FIG. 3D, the display panel 3 is attached so as to abut against the holding member 1. As shown in FIG. 3D, the display panel 3 may be pressed towards the surface 5*a* to be attached to thereby bring the display panel 3 and the surface 5*a* to be attached into close contact via the weak adhesive layer 6. After attachment of the display panel 3 has completed, in a case where the weak adhesive layer 6 and the display panel 3 or the surface 5*a* to be attached do not contact with each other, it is preferable to carry out the above pressing work of the display panel 3. In addition, as described above, in a case where the weak adhesive layer 6 is formed using the adhesive agent that develops adhesiveness by applying a pressure, the display panel 3 and the surface 5*a* to be attached can be brought into close contact with each other via the weak adhesive layer 6 by carrying out such a step of pressing the display panel 3.

FIG. 3D shows an example of a case in which the display panel 3 is pressed with a pressing member 101. The pressing member 101 may be moved from the vicinity of the holding member 1 towards the upper end part of the display panel 3, when the display panel 3 is pressed towards the surface 5*a* to be attached. By pressing the display panel 3 in this way it is possible to discharge the air that can be air bubbles in the interface between the weak adhesive layer 6 and the display panel 3 or the surface 5a to be attached to the outside. Consequently, the weak adhesive layer 6 and the display panel 3 or the surface 5a to be attached can be reliably brought into close contact with each other. The pressing member 101 is not limited in particular as long as it is possible to apply a pressure to the display panel 3. In a case where the pressing member 101 is moved, a member capable of rolling such as a roller is preferable as the pressing member 101 from the viewpoint of reduction of a stress imparted to the display panel 3.

Figure 4:
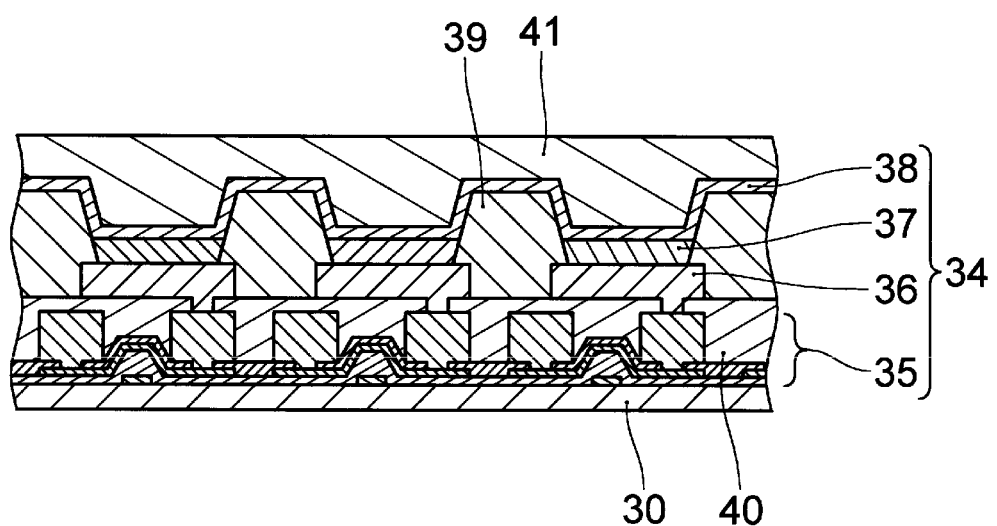
FIG. 4 is a structural example of essential parts of an organic EL display panel used as a display panel.

An example of a structure of an organic EL display panel used as the display panel 3 will be described referring to FIG. 4 which shows an example thereof in an enlarged manner. As shown in FIG. 4, the display panel 3 includes a substrate 30 and a plurality of light emitting elements 34 formed on the substrate 30. As the substrate 30, a resin film formed using a polyimide resin or a glass plate is exemplified. For example, on the flexible substrate 30 formed by a slot die coating technique using the polyimide resin or the like, a plurality of organic EL light emitting elements (light emitting elements 34) are formed in a matrix form. Each of the light emitting elements 34 has: a TFT (thin film transistor) 35; a first electrode 36 connected to the TFT 35; an organic layer 37 to emit light formed of an organic material vapor-deposited on the first electrode 36; and a second electrode 38 formed on the organic layer 37. Each of the light emitting elements 34 is separated from other light emitting elements 34 by an insulation bank 39 formed using an insulation resin or $SiO_2$ or the like. The first electrode 36 and the insulation bank 39 are formed on a flattening layer 40 that covers the TFT 35.

The TFT 35 can be formed by forming a channel layer composed of polycrystalline silicon or the like, an insulation layer, and each electrode, which are formed through, for example, a step of forming a film by sputtering or the like, steps of exposure and development for photoresist, and a step of patterning by etching. Alternatively, a transparent amorphous oxide semiconductor such as an oxide of indium, gallium, and zinc may be used for the channel layer. The first electrode 36 is formed by forming a film and patterning using a conductive material having light transmission property such as an ITO layer. Then, the insulation bank 39 is formed by forming a resin layer and patterning the resin layer, and within each division surrounded by the insulation bank 39, the organic layer 37 is formed using a vacuum vapor deposition technique using a mask, or an inkjet technique or the like. Although the organic layer 37 is shown as a single layer in FIG. 4, actually, a hole injection layer, a hole transport layer, a light emitting layer, an electron transport layer, and an electron injection layer or the like are formed in order by the vacuum vapor deposition technique or the like so that the organic layer 37 having a multilayered structure is formed. Each layer of the organic layer 37 can be formed using a known material. Then, the second electrode 38 is formed to be sufficiently thinner than a light wavelength so as to have transparency by using a technique such as vacuum vaper deposition. The second electrode 38 is formed using, for example, a metal with a small work function such as an Mg—Ag alloy layer or aluminum or an alkaline metal or an alkaline earth metal. Further, on a surface of the second electrode 38, a protection layer 41 made of, for example, $Si_3N_4$ is formed. The barrier layer 33 (refer to FIG. 3C) described above may be formed as the protection layer 41. The cross-sectional structure shown in FIG. 4 is provided as a mere example, and the structure of the organic EL display panel constituting the display panel 3 and materials for each constituent element and forming method for the constituent element are not limited to the structures, the materials, and the forming method described herein.

It can be appreciated that in a case where the display panel 3 is the liquid crystal display panel (not shown), the display panel 3 includes: a first substrate formed using a very thin glass plate or the like; a second substrate having flexibility, which is disposed to be spaced from the first substrate; and a liquid crystal layer between the first and second substrates. The display panel 3 is provided with: a TFT formed on the first substrate; a pixel electrode connected to this TFT; and a first alignment film formed on the pixel electrode. In addition, the display panel 3 may be provided with: a color filter, a common electrode, and a second alignment film, all of which are provided in order on the second substrate. The liquid crystal layer is composed of a liquid crystal material filled between the first and second alignment films. A polarization film is provided on each of respective surfaces of the first substrate and the second substrate, which are opposite to the surfaces facing the liquid crystal layer. In a case where a liquid crystal display panel is formed as the display panel 3, each electrode, alignment films, polarization films, and liquid crystal layer which constitute the liquid crystal display panel can be formed by any method including a well-known method. Therefore, a detailed description thereof is omitted.

The display panel 3 formed of the organic EL display panel or the liquid crystal display panel is preferably manufactured simultaneously in plurality by using a substrate (for example, substrate 30) having a size in which a plurality of display panels 3 can be arrayed. In addition, after the respective constituent elements of the display panel 3 have been formed, the plurality of display panels 3 which are arranged on the substrate are divided by cutting the substrate and separated each other. At the time of the above cutting and separation, the concave portion 3a or the like mentioned above can be formed.

Figure 5A:
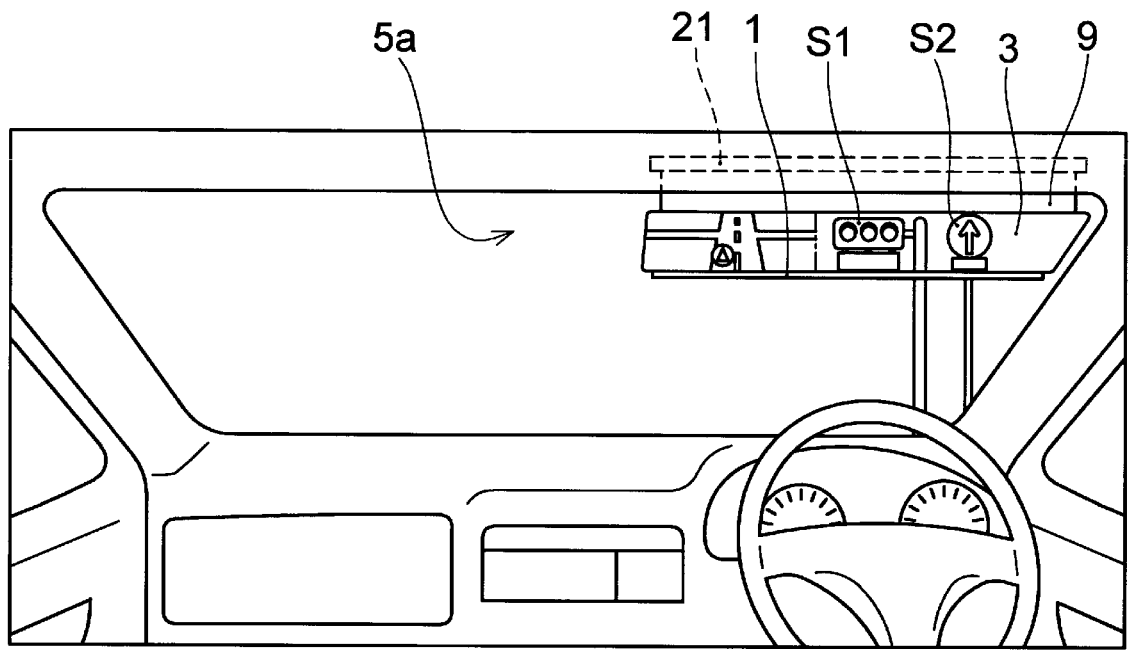
FIG. 5A is a view showing an example of a case in which the display apparatus of FIG. 1A is mounted to a windshield of a motor vehicle.

In FIG. 5A, there is shown an example of the display panel 3 attached to a windshield of a motor vehicle by the method for attaching the display panel of Embodiment 2. In the example of FIG. 5A, the display panel 3 of the present embodiment is attached to the windshield of the motor vehicle having the surface 5a to be attached as a surface facing an interior of the vehicle. That is, the holding member 1 is bonded with the surface 5a to be attached (the surface of the vehicle windshield facing interior of the vehicle), and the display panel 3 is held by the holding member 1. In addition, the display panel 3 in the example of FIG. 5A is a transparent organic EL display panel formed using a light transmissible material, and in a right side region of the display panel 3, light emission in pixel 31 (refer to FIG. 1A) is stopped. Thus, a front side scene, through the windshield, including such as signal S1 and a various traffic signs S2 is visible in the right side region of the display panel 3. On the other hand, in a left side region of the display panel 3, an image produced by a navigation system is displayed by driving the pixel 31. The display panel 3, as in the example of FIG. 5A, may be capable of partially displaying an image on the display screen, or may be such a partial display.

A vehicle windshield is often mounted on a vehicle so as to incline a top edge thereof to an interior of the vehicle. The operation of attaching the display panel 3 to a surface of such windshield which faces the interior of the vehicle is carried out in a face-up state, therefore, it is very difficult to accurately position the display panel 3 in a predetermined position in such a state. Further, in the operation in such a difficult situation, the display panel 3 may not be able to be attached in an accurate position at first try, and correction of the position or retrial of the operation of the attaching may be required. Thus, there is a risk that the display panel 3 is broken through the additional operations. However, by using the method for attaching display panel according to the present embodiment, it is possible to attach the display panel 3 easily as well as accurately at the predetermined position even on the vehicle windshield.

Although in the example of FIG. 5A, the holding member 1 is bonded in the vicinity of an upper edge of the windshield in front of a driver seat, the holding member 1 can be attached in any position on the windshield. In addition, a plurality of holding members 1 may be bonded to the windshield, and a plurality of display panels 3 may be attached.

In addition, in the example of FIG. 5A, the holding member 1 is bonded to the windshield in a downward location of the display panel 3 in the gravitational direction at the time of normal use of the motor vehicle. Therefore, downward movement of the display panel 3 by the gravitational action can be restricted by the holding member 1. However, as described later, the positional relationship is not limited to this.

Furthermore, in the example of FIG. 5A, the wiring board 9 extends to a space between an upholstery of the ceiling part in the interior of the vehicle and a roof of the vehicle at the upper edge of the windshield. The wiring board 9 is inserted into a connector 21 disposed between the upholstery of the ceiling part and the roof of the vehicle. The connector 21 may be coupled to a driver (not shown) to supply a drive signal to the display panel 3. By way of such arrangement, it is possible to reduce a length of the wiring board 9. Further, the display panel 3 can be accurately attached at the predetermined position by using the method for attaching display panel 3 of the present embodiment, therefore, any excessiveness or shortage of the length of the wiring board from the display panel 3 to the connector 21 hardly occurs. Therefore, it is possible to reduce exposure of the wiring board 9 inside the interior of the vehicle.

Figure 5B:
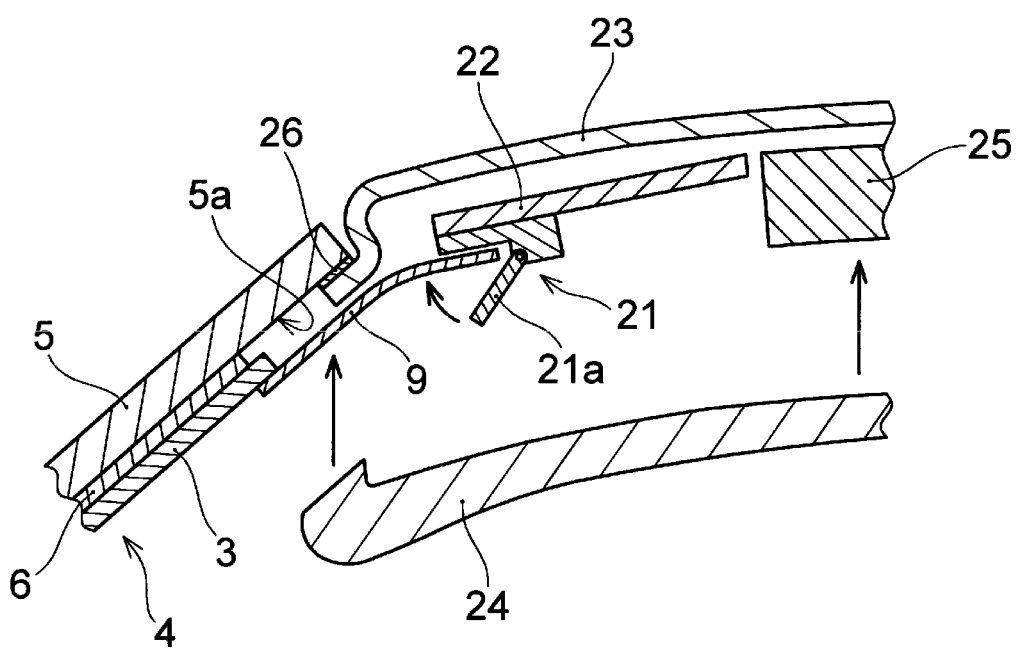
FIG. 5B is a view of partial steps of a method for mounting a display panel to the windshield of the motor vehicle.

In FIG. 5B, there is shown additional steps to be carried out to obtain the form illustrated in FIG. 5A in a case where the display panel 3 is attached to the windshield of the motor vehicle by using the method for attaching the display panel of the present embodiment. As shown in FIG. 5B, the method for attaching the display panel to the windshield by using the method of the present embodiment may include the step of connecting the flexible wiring board 9 that is connected to the display panel 3 to the connector 21 that is disposed at the ceiling part of the vehicle of the motor vehicle, after the display panel 3 has been attached to the predetermined location. Afterwards, the interior member 24 that covers the connector 21 may be mounted to the ceiling part of the vehicle. In the example of FIG. 5B, the connector 21 provided with a lock lever 21*a* is implemented on the substrate 22 on which a driver (not shown) to supply a drive signal to the display panel 3 has been implemented. The connector 21 is disposed in the predetermined location in a space secured between the roof 23 and the interior member 24 in the ceiling part of the vehicle. On a surface facing to the outside of the vehicle at an end of the roof 23, an upper end of a surface (surface 5*a* to be attached) facing to the interior of the vehicle of a windshield (object 5) is bonded with the bonding agent 26. Reference numeral 25 designates a sound insulation member disposed between the roof 23 and the interior member 24.

Although in the example described above, the holding member 1 was located at the lower end of the display panel 3, the location of the holding member 1 is not limited to the lower end of the display panel 3. The holding member 1 may be disposed at a side edge or an upper edge of the display panel 3. This is because the display panel 3 is bonded with the object 5 by way of the weak adhesive layer 6. As long as the concave portion and the convex portion described above is formed at the side edge of the display panel, the display panel 3 can be supported by the concave portion and the convex portion to a certain extent. In addition, if the holding member 1 is provided at an upper part of the display panel 3, a part of the display panel 3 is inserted into the groove 1*b* of the holding member 1 and thus is also supported by the holding member 1 to a certain extent.

Such an example in a case where the holding member 1 is provided at the upper part of the display panel 3 is shown in FIG. 6A and FIG. 6B. FIG. 6A is a plan view showing a state in which at an upper edge of the windshield (object 5) of the motor vehicle, for example the holding member 1 is bonded in which the groove 1*b* is located so as to be oriented downward, and the display panel 3 is provided so as to be inserted into the groove of the holding member 1, and FIG. 6B shows a sectional view after attachment. Each component is the same as the example described above, and the same portions are designated with the same reference numerals and description thereof is omitted. In this case, the concave portion 3*a* (or the convex portion) of the display panel 3 is, of course, formed at the upper edge of the display panel 3.

By employing this structure, even if the holding member 1 is attached to the windshield of the motor vehicle, this holding member is hardly conspicuous. Thus, the display panel 3 is removed when not in use, and the scene of the front side can be thereby observed without any feeling of any sense of discomfort. As described above, as long as the display panel 3 is formed of transparent components, the scene of the front side can be observed even if display panel 3 is not detached.

SUMMARY (1) A display apparatus according to Embodiment 1 of the present invention comprises: an object having a plane or curved surface; a display panel having at least one of a concave portion and a convex portion at any part of peripheral edge; a holding member mounted on a predetermined location of the object, the holding member having a convex portion or a concave portion corresponding to and engaging with the concave portion or the convex portion of the display panel; and a weak adhesive layer interposed between the object and the display panel to bring the object and the display panel into close contact with each other.

According to the display apparatus of Embodiment 1, a concave portion and a convex portion which are formed in the holding member and the display panel so as to be capable of engaging each other, so that a position or a direction of attachment of the display panel is specified by the holding member. Further, the holding member can be made very small, and even if the holding member is mounted to a window glass or a windshield of a motor vehicle or the like, any sense of discomfort is not felt. Moreover, the holding member is attached by the weak adhesive layer, so that the holding member can be easily released, and in a case where the display panel is not in use, the display panel can be detached, and the holding member is left in place as it is, and the display panel can be thereby attached in a case where the display panel is in use as well.

(2) It is preferable that the holding member has a length of 1/12 or more and 1/3 or less of a length of an outer peripheral edge of the display panel, and is formed of a transmissible material, whereby any sense of discomfort is not felt while the display panel is held in an accurate location and direction because the holding member is very small.

(3) It is preferable that the holding member is divided into a plurality of sections, and a length of each section of the plurality of sections of the holding member has a length of 1/50 or more and 1/12 or less of a length of an outer peripheral edge of the display panel.

(4) A method for attaching a display panel of a second embodiment of the present disclosure comprises: preparing a display panel having at least one of a concave portion and a convex portion at any part of a peripheral edge; preparing a holding member having a convex portion or a concave portion corresponding to the concave portion or the convex portion of the display panel; bonding the holding member to an object having a predetermined plane or curved face; providing a weak adhesive layer, using an adhesive agent, on an attachment region of the object with the display panel, or a surface facing to the object in the display panel; and combining the display panel to the holding member while engaging the concave portion or the convex portion of the display panel with the convex portion or the concave portion of the holding member, and bringing the display panel into close contact with the object with the weak adhesive layer.

According to the attaching method of Embodiment 2, a concave portion and a convex portion are formed in the holding member and the display panel so as to be capable of engaging each other, and thus even by a very short holding member, the display panel can be accurately mounted to the holding member. In addition, the holding member is aligned without attaching the display panel and then only the holding member can be bonded to the object and thus it is not need to peel off the display panel for reason that the bonded location of the display panel is inappropriate, and the display panel can be attached very accurately and efficiently in a predetermined location and a predetermined orientation.

(5) A groove capable of inserting a lower end of the display panel is formed in the holding member, and the lower end of the display panel is inserted into the groove, whereby even by way of a short holding member, the display panel can be strongly held, and the holding member can be provided at a side or an upper part of the display panel.

(6) It is preferable that the holding member is formed of a light transmissible member, and the display panel is an organic EL display panel formed on a light transmissible substrate, whereby even if the holding member or the display panel is left, the scene of the front side can be observed.

(7) It is preferable that the weak adhesive layer is formed of using an adhesive agent that develops adhesiveness by applying a pressure, whereby when a display panel is attached, the display panel is engaged with a holding member without being bonded with the object and thereafter it is able to attached by applying the pressure.

(8) It is preferable that when the display panel is brought into close contact with the object, and the display panel is sequentially pressurized from a vicinity of the holding member towards an opposite location to the holding member, thereby the display panel can be attached without involvement of air bubbles.

(9) It is preferable that the holding member is bonded at a vicinity of an outer edge of the object and along the outer edge of the object, because the holding member is almost conspicuous and any sense of discomfort is not felt by detaching a display panel, even when the display panel is attached to a window glass or a windshield of a motor vehicle.

(10) A method for attaching a display panel to a windshield of the motor vehicle by using the method for attaching a display panel of any one of (4) to (9), further comprising: bringing the display panel into close contact with a predetermined location and thereafter connecting a connector disposed in a ceiling part of a motor vehicle with a flexible wiring board connected to the display panel; and mounting an interior member covering the connector to the ceiling part because the wiring board is made inconspicuous.

DESCRIPTION OF REFERENCE NUMERALS

1 Holding member
1a Convex portion
1b Groove
1c Concave portion
3 Display panel
3a Concave portion
3c Convex portion
5 Object
6 Weak adhesive layer
9 Wiring board
10 Display apparatus

The invention claimed is:

1. A display apparatus comprising:
an object having a plane or curved surface;
a display panel having at least one of a concave portion and a convex portion at any part of a peripheral edge;
a first holding member mounted on a predetermined location of the object, the first holding member having a convex portion or a concave portion corresponding to and engaging with the concave portion or the convex portion of the display panel; and
a second holding member comprising a weak adhesive layer interposed between the object and the display panel to bring the object and the display panel into close contact with each other, the weak adhesive layer being in direct contact with both of the object and the display panel.

2. The display apparatus according to claim 1, wherein the first holding member has a length of 1/12 or more and 1/3 or less of a length of an outer peripheral edge of the display panel, and is formed of a transmissible material.

3. The display apparatus according to claim 1, wherein the first holding member is divided into a plurality of sections, and
a length of each section of the plurality of sections has a length of 1/50 or more and 1/12 or less of a length of an outer peripheral edge of the display panel.

4. The display apparatus according to claim 1, further comprising a bonding agent to bond the first holding member to the object.

5. The display apparatus according to claim 4, wherein a bonding strength of the bonding agent is larger than an adhesion strength between the object and the display panel.

6. The display apparatus according to claim 4, wherein a bonding strength of the bonding agent is larger than 5.0 N/10 mm and 10 N/10 mm or less.

7. The display apparatus according to claim 1, wherein an adhesion strength between the weak adhesive layer and either one of or both of the display panel and the object is 0.02 N/10 mm or more and 5.0 N/10 mm or less.

8. The display apparatus according to claim 1, wherein the weak adhesive layer is capable of inhibiting a flotation of the display panel from the object and generation of an air bubble between the display panel and the object.

9. The display apparatus according to claim 1, wherein the display panel comprises a substrate, and the concave portion or the convex portion of the display panel is formed on the substrate.

10. The display apparatus according to claim 1, wherein the convex portion or the concave portion of the first holding member and the concave portion or the convex portion of the display panel are engaged so as to eliminate rotation of the display panel.

11. The display apparatus according to claim 1, wherein one of the display panel and the object has a strong adhesive layer having an adhesive force which is equal to or more than an adhesive force of the weak adhesive layer on a surface of the display panel or the object that is in contact with the weak adhesive layer.

12. A method for attaching a display panel, comprising:
preparing the display panel having at least one of a concave portion and a convex portion at any part of a peripheral edge;
preparing a first holding member having a convex portion or a concave portion corresponding to the concave portion or the convex portion of the display panel;
bonding the first holding member to an object having a predetermined plane or curved face;
providing a second holding member comprising a weak adhesive layer, using an adhesive agent, on an attachment region of the object with the display panel, or a surface facing to the object in the display panel; and
combining the display panel to the first holding member while engaging the concave portion or the convex portion of the display panel with the convex portion or the concave portion of the first holding member, and bringing the display panel into close contact with the object with the weak adhesive layer being in direct contact with both of the object and the display panel.

13. The method according to claim 12, wherein a groove capable of inserting a lower end of the display panel is formed in the first holding member, and the lower end of the display panel is inserted into the groove.

14. The method according to claim 12, wherein the first holding member is formed of a light transmissible member, and
the display panel is an organic EL display panel formed on a light transmissible substrate.

15. The method according to claim 12, wherein the weak adhesive layer is formed of an adhesive agent that develops adhesiveness by applying a pressure.

16. The method according to claim 15, wherein when the display panel is brought into close contact with the object, the display panel is sequentially pressurized from a vicinity of the first holding member towards an opposite location to the first holding member.

17. The method according to claim 12, wherein the first holding member is bonded at a vicinity of an outer edge of the object and along the outer edge of the object.

18. A method for attaching the display panel to a windshield of a motor vehicle by using the method according to claim 12, further comprising:
bringing the display panel into close contact with a predetermined location and thereafter connecting a connector disposed in a ceiling part of the motor vehicle with a flexible wiring board connected to the display panel; and
mounting an interior member covering the connector to the ceiling part.

19. The method according to claim 12, the display panel and the object are brought into close contact with each other with the weak adhesive layer so that a flotation of the display panel from the object and generation of an air bubble between the display panel and the object are inhibited by the weak adhesive layer.

20. The method according to claim 12, wherein the first holding member is bonded with a bonding agent.

* * * * *